(12) United States Patent
Euzent et al.

(10) Patent No.: US 7,210,081 B1
(45) Date of Patent: Apr. 24, 2007

(54) APPARATUS AND METHODS FOR ASSESSING RELIABILITY OF ASSEMBLIES USING PROGRAMMABLE LOGIC DEVICES

(75) Inventors: Bruce Euzent, Sunnyvale, CA (US); Roy Wei-Guang Wu, San Jose, CA (US); Jeffrey Barton, Santa Rosa, CA (US); Anil Pannikkat, Santa Clara, CA (US); Vadali Mahadev, San Jose, CA (US); Tomas Jonsson, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 639 days.

(21) Appl. No.: 10/465,139

(22) Filed: Jun. 19, 2003

(51) Int. Cl.
*G01R 31/28* (2006.01)
(52) U.S. Cl. ...................... 714/725; 714/734
(58) Field of Classification Search ............... None
See application file for complete search history.

(56) References Cited

U.S. PATENT DOCUMENTS 5,546,406 A * 8/1996 Gillenwater et al. ........ 714/733
5,619,512 A * 4/1997 Kawashima et al. ........ 714/733
6,934,900 B1 * 8/2005 Cheng et al. ............... 714/738

OTHER PUBLICATIONS

Altera Data Sheet, "ByteBlaster Parallel Port," Feb. 1998, Ver. 2.01, pp. 299-313.
Theo Ejim et al., "Designed Experiment To Determine Attachment Reliability Drivers For PBGA Packages," Surface Mount International, San Jose, Aug. 1995, pp. 385-392.
Osterman et al., "Failure Assessment Software For Circuit Card Assemblies", Annual Reliability And Maintainability Symposium, Jan. 1999, 9 pgs.
"A Guiding Influence In The Electronics Industry", Smart Group, www.smartgroup.org, pp. 1-10.

* cited by examiner

*Primary Examiner*—Christine T. Tu
(74) *Attorney, Agent, or Firm*—Law Offices of Maximilian R. Peterson

(57) ABSTRACT

An apparatus performs reliability assessment of electronic hardware. The apparatus includes a test assembly. The test assembly includes at least one programmable logic device (PLD). The PLD is configured to provide a logic function, such as the function of a plurality of inverters coupled in a cascade manner. The apparatus further includes a signal source coupled to the test assembly. The signal source provides a stimulus signal to the test assembly. The apparatus also includes a signal monitor coupled to the test assembly. The signal monitor monitors a response signal generated by the test assembly.

55 Claims, 9 Drawing Sheets

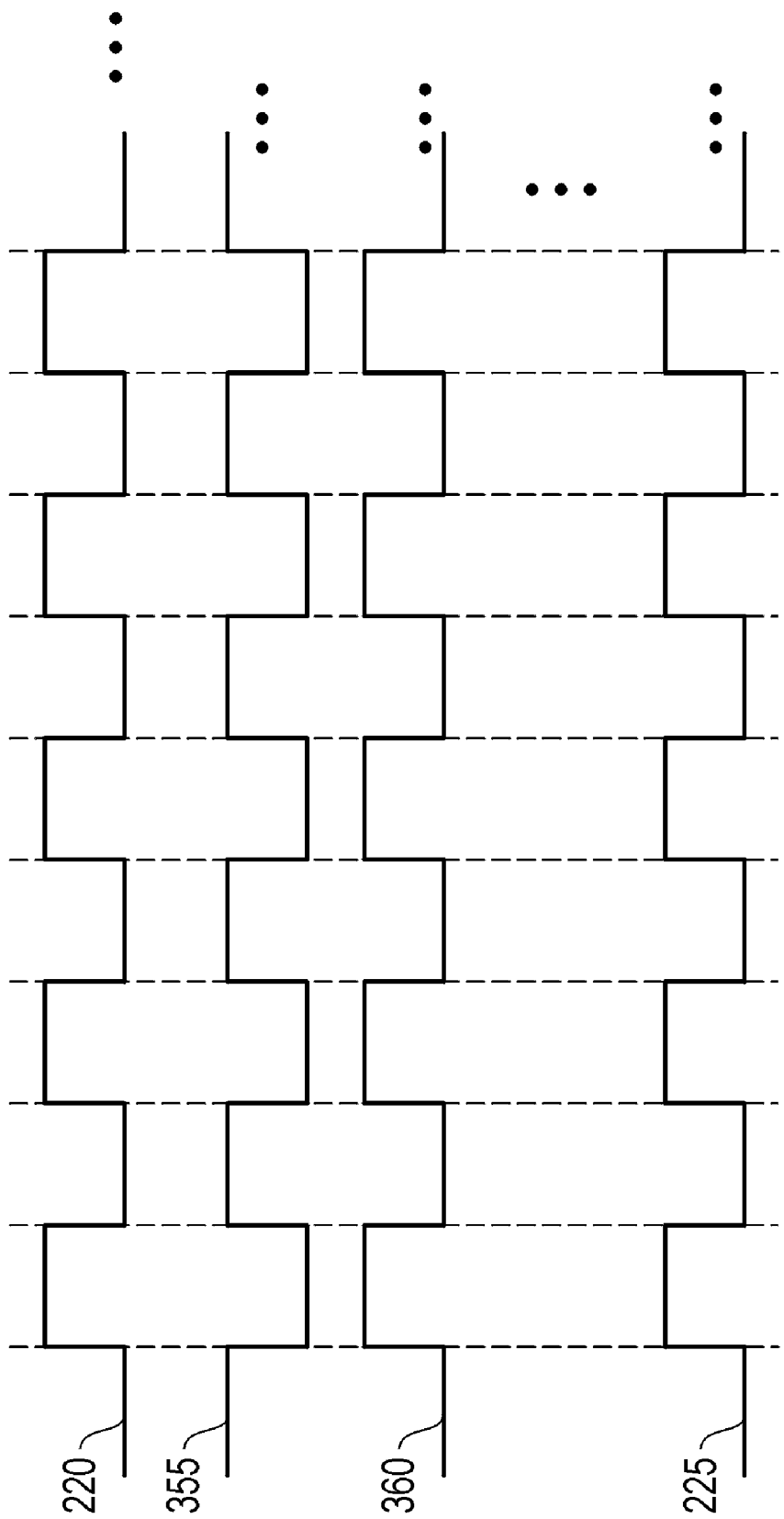

APPARATUS AND METHODS FOR ASSESSING RELIABILITY OF ASSEMBLIES USING PROGRAMMABLE LOGIC DEVICES

TECHNICAL FIELD

This patent application relates generally to reliability assessment and, more particularly, to assessing reliability of assemblies, such as printed circuit boards (PCBs), using programmable logic devices (PLDs).

BACKGROUND

PLDs have increasingly proliferated in many areas of technology, such as data processing and signal processing applications. The flexibility of the PLD and the ability to re-configure the PLD have in part led to their popularity. System designers and even system end-users can program the PLDs and re-configure the functionality of part or all of the system, thus avoiding costly and time-consuming re-design of the system.

The increased utility and flexibility of PLDs, however, has given rise to complex circuitry within the PLDs as well as advanced packaging for the PLDs. To take advantage of the desirable properties of the PLDs, designers and end-users use increasingly sophisticated PCBs. The PCBs not only accommodate the advanced packaging of the PLDs, but also other circuitry that operate in conjunction with the PLDs to implement complex circuitry, such as systems on programmable chips (SOPC).

As part of the overall design or system production, the manufacturer or producer of the design or system tests the PCBs to determine their reliability. Conventional reliability determination of PCBs, however, entails relatively high costs. Furthermore, conventional reliability determination techniques fail to use the actual PLDs that reside on final PCBs supplied to customers or end-users.

SUMMARY

This invention relates to assessing reliability of circuit assemblies for PLDs. One aspect of the invention concerns apparatus for assessing reliability of circuit assemblies. In one embodiment, an apparatus for performing reliability assessment includes a test assembly. The test assembly includes at least one PLD. The PLD is configured to provide a logic function. The apparatus also includes a signal source coupled to the test assembly. The signal source is adapted to provide a stimulus signal to the test assembly. The apparatus further includes a signal monitor coupled to the test assembly. The signal monitor is adapted to monitor a response signal generated by the test assembly.

In a second embodiment, an apparatus according to the invention includes a printed circuit board (PCB), and a plurality of PLDs mounted to the PCB. The apparatus also includes a signal generator. The signal generator is configured to provide a stimulus signal to the PCB. The apparatus further includes a signal monitor. The signal monitor is configured to monitor a response signal provided by the printed circuit board.

In a third embodiment, a reliability assessment apparatus according to the invention includes a PCB, and a PLD mounted to the PCB. The PCB is adapted to provide a stimulus signal to the PLD. The PCB is further adapted to provide a response signal. The response signal indicates continuity in a signal propagation path that includes the PCB and the PLD.

Another aspect of the invention relates to methods of assessing reliability of circuit assemblies. In an exemplary embodiment, a method according to the invention includes providing the circuit assembly, which includes a PLD. The method also includes supplying a stimulus signal to the circuit assembly, and receiving a response signal from the circuit assembly. The response signal is adapted to indicate a failure within the circuit assembly.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

FIGS. 8A and 8B illustrate exemplary waveforms produced in an illustrative embodiment of a test apparatus according to the invention.

DETAILED DESCRIPTION

This invention contemplates apparatus and methods for assessing reliability of circuit assemblies for PLDs. The assemblies include various types of structure, such as PCBs, flexible boards, and the like.

Figure 1:
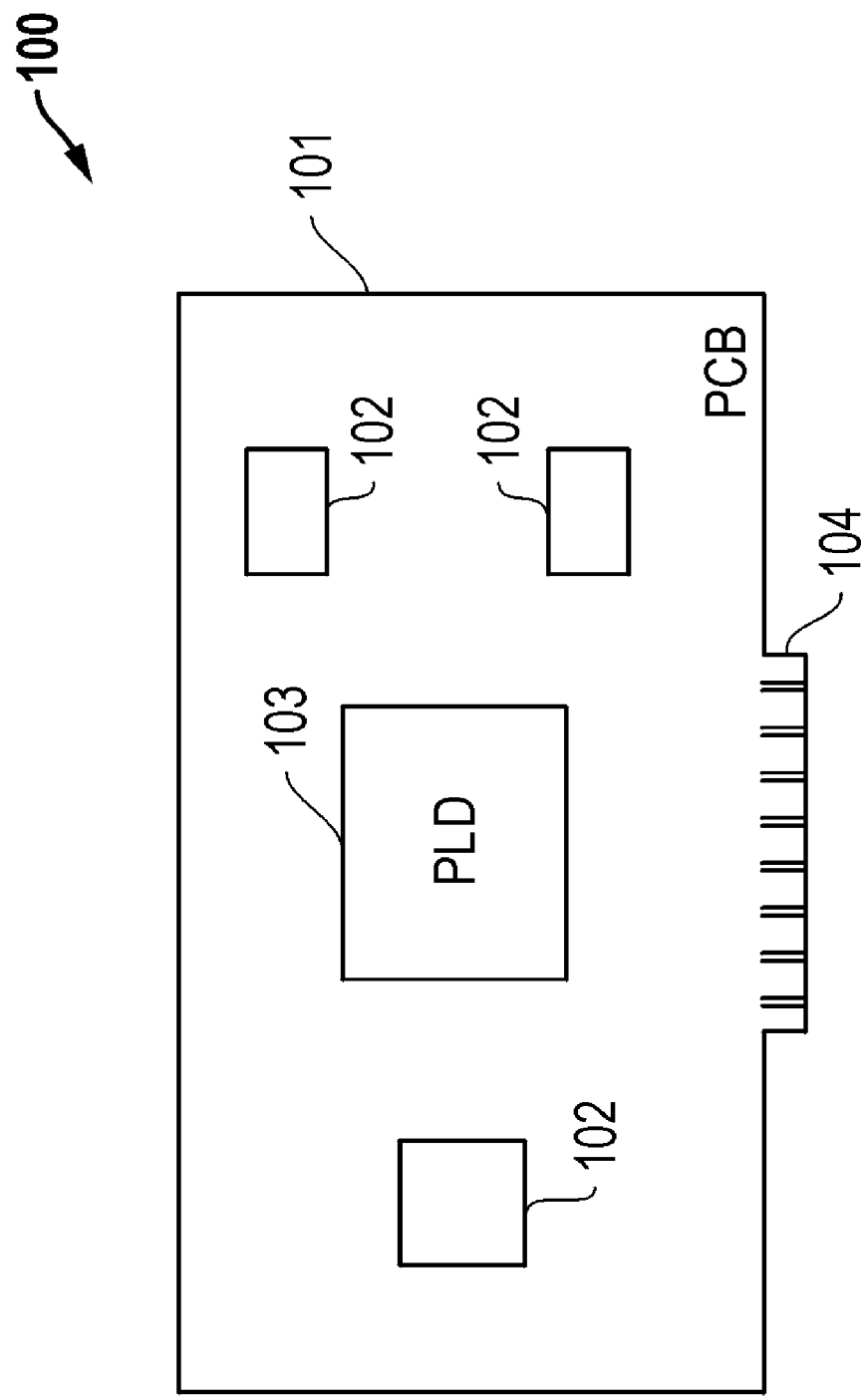
FIG. 1 shows an apparatus that includes a circuit assembly that constitutes part of an overall design or system.

FIG. 1 shows an apparatus 100 that includes a circuit assembly that constitutes part of an overall design or system. Apparatus 100 includes PCB 101. PCB 101 provides a coupling mechanism for the electrical circuitry within apparatus 100. The electrical circuitry includes PLD 103, as well as other electrical circuitry, generally indicated as peripheral circuitry 102. Peripheral circuitry may include integrated circuits (ICs), discrete components (for example, resistors and capacitors), and the like, as desired.

PLD 103 and peripheral circuitry typically mount on or to PCB 101. PCB 101 includes a plurality of traces, interconnects, or similar coupling mechanisms that couple to PLD 103, peripheral circuitry 102, and connector 104 (described below). PCB 101 may have several layers of traces or interconnects. The traces or interconnects within a given layer may couple to traces or interconnects within another layer to provide the desired electrical connections.

PCB 101 may include one or more connectors 104, as desired. Connectors 104 provide a mechanism for apparatus 100 to communicate with other circuitry or devices. For example, connector 104 in FIG. 1 may engage a socket on another assembly to provide electrical connections to apparatus 100. Note that, depending on the performance and design specifications for a particular implementation, the electrical circuitry may include more than one PLD, include fewer or more peripheral circuitry 102, as desired.

Typically, a customer, manufacturer, or system integrator obtains PLD(s) 103 from a PLD manufacturer and uses them to produce apparatus 100. The PLD manufacturer has usually tested PLD(s) 103 before it provides PLD(s) 103 to others, such as its customers, system integrators, and the like. The testing of the PLD(s) 103, however, typically entails electrical and physical testing of PLD(s) 103. In other words, the PLD manufacturer or supplier may test only PLD(s) 103, and not the other components within apparatus 100. Thus, testing PLD(s) 103 does not ensure adequate reliability testing and assessment of apparatus 100, including PCB 101.

Figure 2:
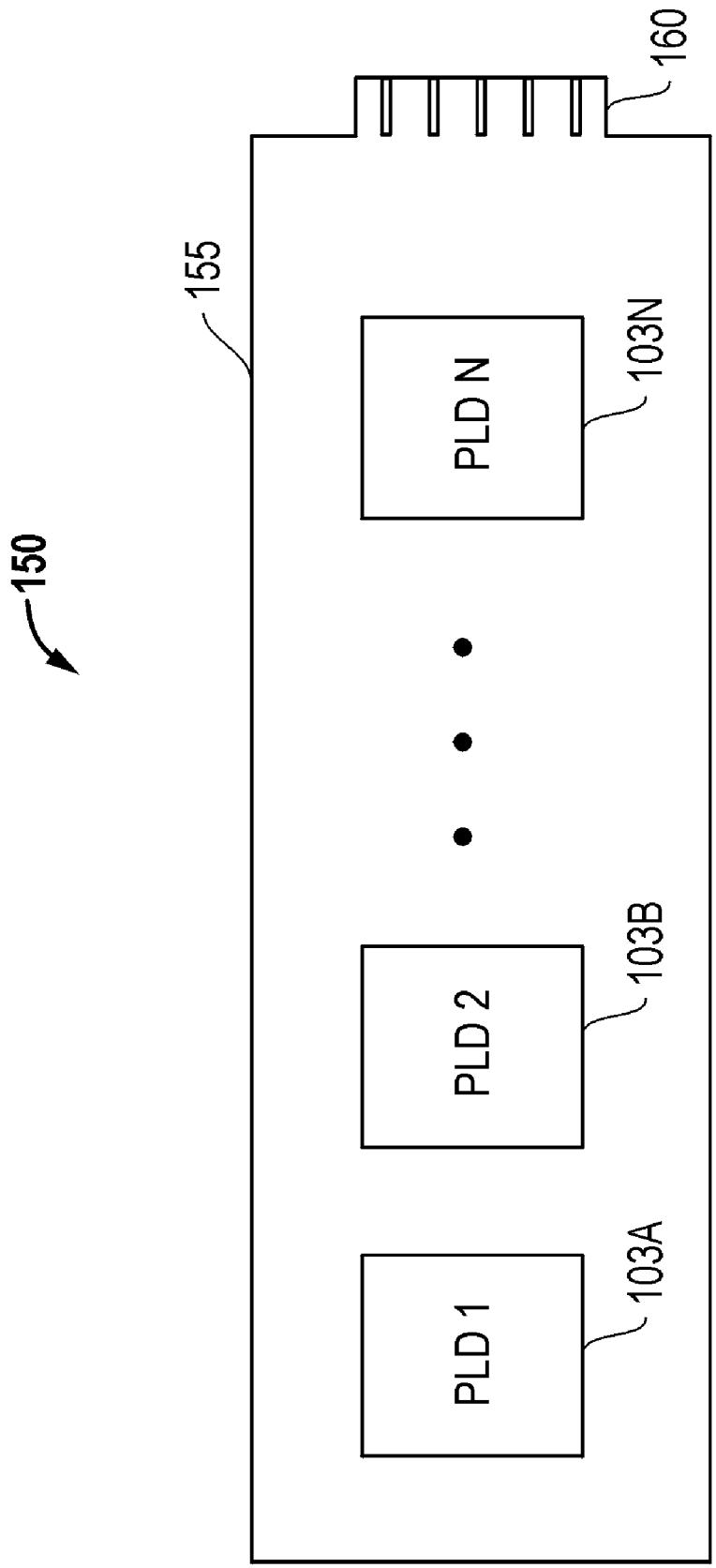
FIG. 2 illustrates an illustrative embodiment of a test assembly for reliability assessment according to the invention.

The inventive concepts provide apparatus and methods for reliability assessment of the circuit assemblies that end-users, system manufacturers, system integrators, and the like, use. FIG. 2 shows an illustrative embodiment of a test assembly 150 for reliability assessment according to the invention. Test assembly 150 includes PCB 155 and a plurality, N, of PLDs, indicated as PLD 103A, PLD 103B, and so on, to PLD 103N. PLDs 103A–103N mount on or to PCB 155. Furthermore, PCB 155 includes traces and other mechanisms for coupling PLDs 103A–103N to each other to form an electrical circuit.

Note that N denotes an integer number, such that $N \geq 1$. In other words, test assembly 150 may include one or more PLDs, as desired. PLDs 103A–103N couple to form a circuit that facilitates assessing the reliability of test assembly 150, as described below in detail. By providing appropriate stimulus signals to test assembly 150 and, hence, to PLDs 103A–103N, one may assess the reliability of test assembly 150, and in particular, PCB 155, as described below in detail.

Test assembly 150 also includes connector 160 (or more than one connector 160, as desired). Connector 160 provides a mechanism for communicating with test assembly 150, for example, for providing power to test assembly 150, for supplying stimulus or test signals to test assembly 150, and for monitoring signals generated by test assembly 150. Connector 160 may engage an appropriate connector on another PCB or in a suitable enclosure to form an electrical circuit with test assembly 150. Connector 160 may also provide some physical support for test assembly 150, as desired.

Test assembly 150 may also include circuitry and mechanisms for configuring or programming PLDs 103A–103N. Depending on the type of PLD used, one may program the PLD using a programming cable. The programming cable may couple to a mechanism on or within test assembly 150 to facilitate or perform the programming of PLDs 103A–103N. The programming cable may also attach to a data source, such as a host, personal computer, workstation, etc., to obtain the programming data. One may use the programming cable to provide the programming data to PLDs 103A–103N before conducting reliability assessment of test assembly 150.

With other types of PLD, one may program the PLD by providing configuration or programming data and information to it. With this type of PLD, connector 160 may include provisions, such as signal, handshaking, and control lines, to support a desired interface for programming PLDs 103A–103N. Connector 160 may couple to a data source, such as a host, personal computer, workstation, etc., to obtain the programming data. One may provide the programming data to PLDs 103A–103N via connector 160 before conducting reliability assessment of test assembly 150.

Figure 3:
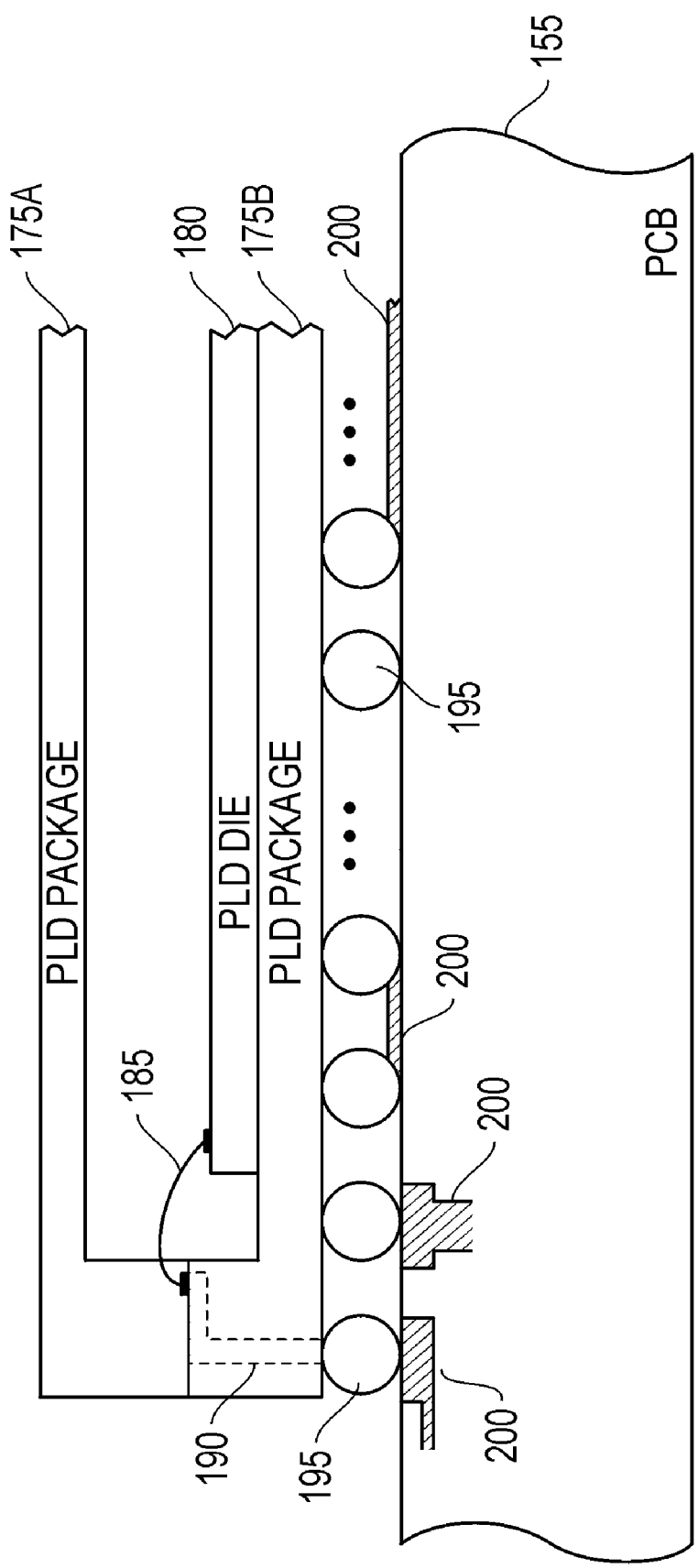
FIG. 3 depicts an example of how the PLDs in an illustrative embodiment according to the invention of the test assembly physically mount to or on the PCB and couple to it.

Even for a relatively simple test assembly 150 that includes a single PLD 103A on PCB 155, a failure in test assembly 150 may have several sources or causes, as described with reference to FIG. 3. FIG. 3 illustrates an example of how PLDs 103A–103N in an illustrative embodiment according to the invention of test assembly 150 physically mount to or on PCB 155 and couple to it. Note that FIG. 3 depicts how one PLD, specifically, PLD 103A mounts to or on PCB 155, using an exemplary package. Similar concepts and description apply to any additional PLDs present in test assembly 150 and to other desired packages.

PLD 103A typically resides in a package (unless one uses an unpackaged PLD die). The package shown in FIG. 3 constitutes merely one example of a PLD package. The PLD package may include a top package portion 175A and a bottom package portion 175B. Top package portion 175A and bottom package portion 175B physically couple to one another to form the package for PLD 103A. Note that, depending on the type of packaging and performance specifications for PLD 103A, PLD 103A may use a wide variety of other packages, for example, packages that do not have distinct top and bottom portions (e.g., a molded package).

PLD die 180 resides within the PLD package (although one may use an unpackaged die in test assembly 150, as desired). PLD die 180 includes the PLD's internal circuitry, such as programmable logic circuitry, as described below. Using a plurality of bond wires 185, PLD die 180 couples to PLD package conductors 190. Bond wires 185 and PLD package conductors 190 electrically couple PLD die 180 to external circuitry. As persons of ordinary skill in the art who have the benefit of the description of the invention understand, some types of packages may not have bond wires (e.g., flip-chip packages). The inventive concepts disclosed here apply effectively to such packages as well.

PLD package conductors 190 couple to a plurality of solder balls 195. Solder balls 195 provide a mechanism for mounting the PLD to PCB 155. Furthermore, solder balls 195 provide a mechanism for coupling PLD package conductors 190 and, hence, PLD die 180, to other electrical circuitry coupled to PCB 155. Note that one may use other arrangements for mounting and coupling the PLD to PCB 155, as desired, and as persons of ordinary skill in the art who have the benefit of the description of the invention understand.

More specifically, solder balls 195 couple to PCB conductors 200. PCB conductors 200 may include PCB traces, vias, and various coupling mechanisms for coupling layers of PCB 155 to one another and/or to circuitry mounted to or on PCB 155 (such as PLD 103A). Some of PCB conductors 200 may reside on either the top or bottom surface of PCB 155, whereas some PCB conductors 200 may reside within PCB 155 (for example, for coupling two or more layers within PCB 155 to one another).

Furthermore, PCB conductors 200 provide a mechanism for communicating various information and signals to and from PCB 155 and circuitry mounted on PCB 155. Thus, PCB conductors 200 facilitate the application of stimulus signals to PLD 103A and the monitoring of signals that PLD 103A generates in response to the application of those signals.

Note that FIG. 3 and its accompanying description correspond to an exemplary package and associated mounting mechanism. One may use other packaging and mounting techniques and mechanisms and still effectively apply the inventive concepts. As persons of ordinary skill in the art who have the benefit of the description of the invention understand, one may apply similar concepts to a wide variety of packaging (e.g., ball grid array (BGA), flip-chip) and mounting techniques, whether existing currently or developed in the future, in order to assess the reliability of the corresponding test assemblies 150, as desired.

To facilitate and enhance the reliability assessment, one may manufacture or produce PCB 155 using the same or similar materials and process steps as the final PCB that will include and use PLDs 103A–103N. The final PCB may constitute the PCB used and/or produced by the end-user, system manufacturer, or system integrator. For example, if one plans on using PLDs 103A–103N in an SOPC produced by a system integrator, one may consider as the final PCB the PCB that the system integrator uses to implement the SOPC. The final PCB, when manufactured and assembled, includes PLDs 103A–103N and any other system components (e.g., memory modules or chips, controllers, interface circuits), as well as peripheral circuitry, such as capacitors, resistors, and the like.

To further facilitate and enhance the reliability assessment, one may use in test assembly 150 the same or similar components, PLDs, and peripheral circuitry as the final assembly. The final assembly may constitute the assembly used and/or produced by the end-user, system manufacturer, or system integrator that includes the final PCB, as described above. In particular, using the same PLDs in test assembly 150 as the final assembly helps to identify any fault or failure mechanisms caused by PLDs 103A–103N, or to rule out such fault or failure mechanisms.

Manufacturing or producing test assembly 150 and PCB 155 using the same or similar materials, components, and processes as the final assembly and the final PCB provides several advantages. First, by using the same circuit components, including PLDs 103A–103N, one may duplicate and/or identify any fault or failure mechanisms or points caused by those components. For example, suppose that one of the PLDs manufactured using a particular manufacturing, say, PLD 103B, fails when subjected to certain combinations of temperature and humidity. By using PLDs manufactured using the same process in test assembly 150, one may duplicate and/or identify those faults while testing test assembly 150. Consequently, one may address and remedy those faults before continuing the reliability assessment.

In contrast, conventional techniques for assessing reliability of assemblies fail to use the actual components. For example, a conventional technique may use a "dummy" chip instead of an actual PLD. The dummy chip fails to duplicate any faults or failure mechanisms in the actual PLD circuitry. As a result, conventional techniques fail to identify such faults or failure mechanisms.

Second, compared to their conventional counterparts, reliability assessment according to the invention costs less because it eliminates the cost of designing and manufacturing special daisy-chain die and packages. Third, using such an assembly allows improved duplication and/or identification any faults or failure modes or points, as may be the case. For example, suppose that the manufacturing process used to make the final PCB produces faulty PCB conductors 200 (see FIG. 3). Manufacturing PCB 155 in test assembly 150 by using the same process allows the duplication and identification of those faults in test assembly 150, thus enhancing the reliability assessment.

Fourth, in a similar manner, one may identify any failure or fault modes or points resulting from the mounting of PLDs 103A on or to PCB 155. For example, suppose that the manufacturing process for the final assembly produces faulty solder balls 200 (see FIG. 3). By using the same process to manufacture test assembly 150, one may duplicate identify those faults in test assembly 150.

Fifth, the inventive concepts use PLDs that have the same electrical and physical characteristics as the PLDs that the end-users and customers use, thus making the reliability assessment more pertinent to the end-users' application. Sixth, eliminating the use of customized daisy-chain mechanisms saves time and reduces the time for qualifying a product.

As noted above, reliability assessment according to the invention entails programming PLDs 103A–103N. The following discussion, along with accompanying FIGS. 4–8, describes how programming PLDs 103A–103N facilitates reliability assessment of test assembly 150 (see FIG. 2).

Figure 4:
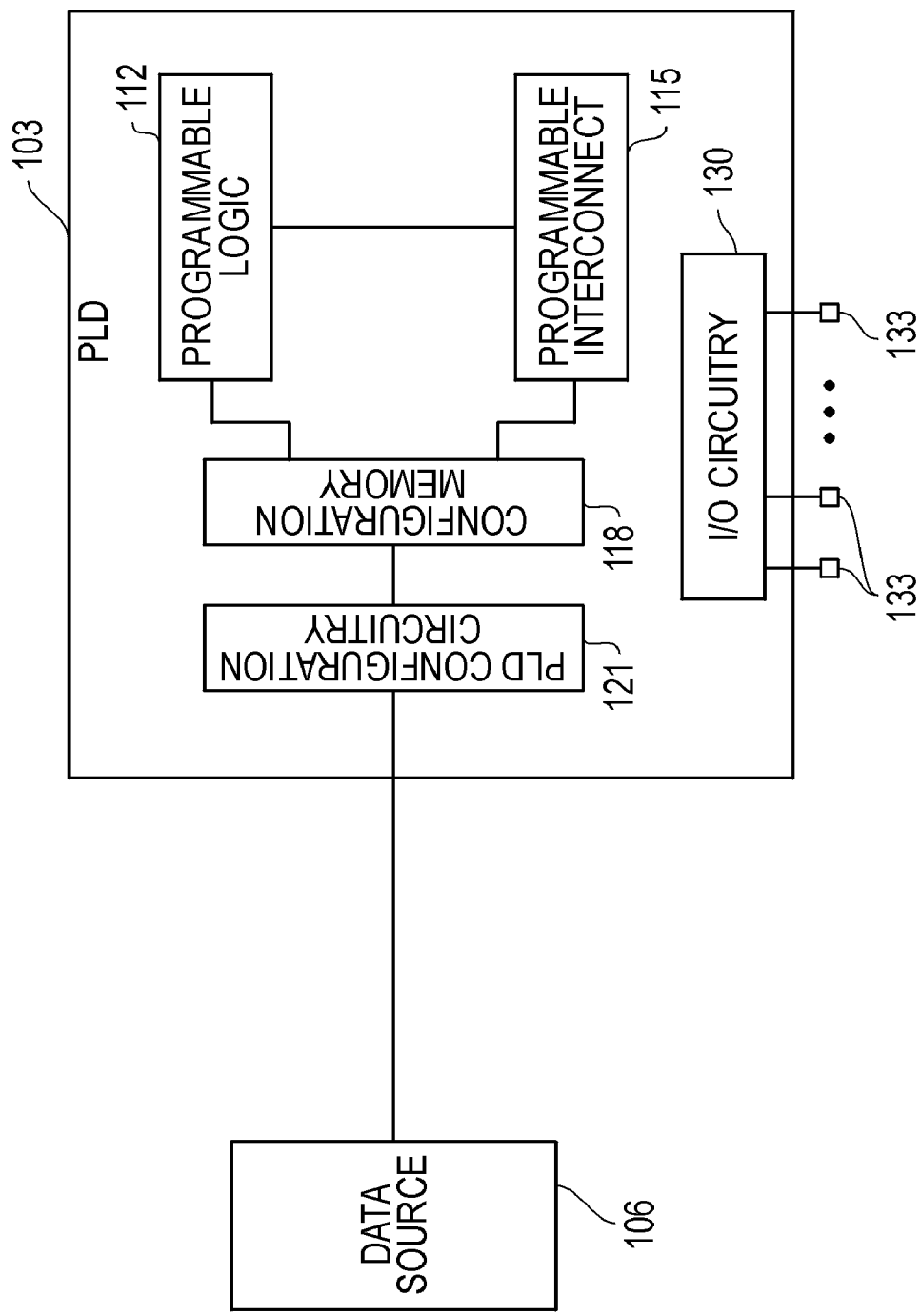
FIG. 4 shows a block diagram of a PLD and a circuit arrangement for programming the PLD to facilitate reliability assessment according to the invention.

FIG. 4 shows a block diagram of a PLD 103 and a circuit arrangement for programming PLD 103 to facilitate reliability assessment according to the invention. PLD 103 constitutes an example of a PLD that one may use in test assembly 150, for example, PLD 103A in FIG. 2. Note that FIG. 4 depicts a simplified, conceptual block diagram of PLD 103. Thus, PLD 103 may have other circuitry and circuit arrangements than shown in FIG. 4, as persons of ordinary skill in the art who have the benefit of the description of the invention understand.

PLD 103 includes programmable logic 112, programmable interconnect 115, and configuration memory 118. Programmable logic 112 includes blocks of configurable or programmable logic circuitry, such as look-up tables (LUTs), product-term logic, multiplexers, logic gates, registers, memory, and the like. Programmable interconnect 115 couples to programmable logic 112 and allows the establishment of configurable or programmable interconnects (coupling mechanisms) between various blocks within programmable logic 112 and within PLD 103.

Configuration memory 118 operates in conjunction with PLD configuration circuitry 121. Upon power-up or reset, PLD configuration circuitry 121 accesses data source 106 to obtain configuration data. Data source 106 may constitute a suitable device for storing and providing configuration data, such as a computer, host, workstation, storage device, memory, etc.

PLD configuration circuitry 121 stores the configuration data in configuration memory 118. Configuration memory 118 couples to programmable logic 112 and programmable interconnect 115. The configuration data within configuration memory 118 determine the functionality of PLD 103 by programming or configuring programmable logic 112 and programmable interconnect 118, as persons skilled in the art with the benefit of the description of the invention understand.

Programmable logic 112 and programmable interconnect 115 couple to I/O circuitry 130. I/O circuitry 130 in turn couples to a plurality of I/O terminals 133. I/O terminals 133, for example, I/O pins in a PLD package, provide a mechanism for the programmed logic functionality in PLD 103 to couple to, and communicate with, circuitry external to PLD 103. In other words, the programming or configuration data in configuration memory 118, prescribe or determine how programmable logic 112 and programmable interconnect 115 provide the desired logic functionality through I/O terminals 133.

Figure 5:
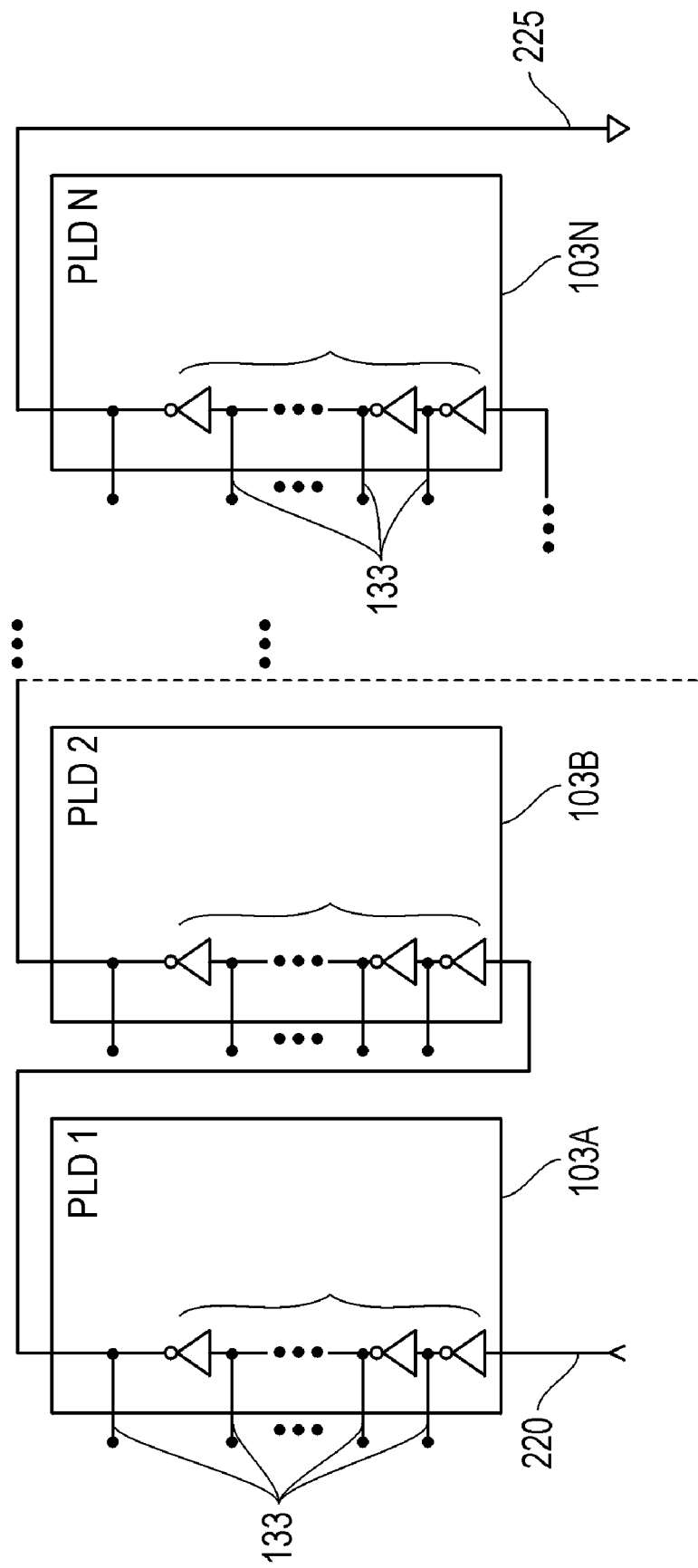
FIG. 5 illustrates a conceptual block diagram of an illustrative embodiment of a test assembly according to the invention.

FIG. 5 depicts a conceptual block diagram of an illustrative embodiment of test assembly 150 according to the invention. As noted above, PLDs 103A–103N couple to one another to facilitate reliability assessment of test assembly 150. More specifically, one programs each of PLDs 103A–103N to implement a cascade of blocks, each with a prescribed logic function. As persons of ordinary skill in the art with the benefit of the description of the invention understand, one may use a wide variety of interconnection schemes and patterning of the blocks within the PLD, for example a cascade pattern, a spiral or swirl arrangement (e.g., coupling the blocks in a spiral pattern, starting with one corner of an array of blocks and ending its center), etc., as desired.

In the embodiment shown in FIG. 5, each of PLDs 103A–103N implements a cascade of a plurality of logic inverters. As persons of ordinary skill in the art who have the benefit of the description of the invention understand, however, rather than inverters, one may program PLDs 103A–103N to implement any desired logic functionality. For example, one may implement a cascade of buffers or logic gates, as desired. Furthermore, PLDs 103A–103N need not all implement the same logic function, and each PLD may implement a different logic function, as desired.

Referring to FIG. 5, for each of PLDs 103A–103N, I/O terminals 133 provide access to intermediate points within the cascade of inverters (or other desired logic function). In exemplary embodiments, one uses all of I/O terminals in each of PLDs 103A–103N as access terminals to points within the cascade of logic blocks implemented in that PLD.

Note that PLDs 103A–103N couple to each other in a cascade manner. In other words, the output of the cascade of inverters in PLD 103A couples to the input of the cascade of inverters in PLD 103B, and so on. One applies a stimulus signal 220 to the input of the cascade of inverters in PLD 103A (the first PLD in the cascade of PLDs). Stimulus signal 220 propagates through the cascade of inverters in each of PLDs 103A–103N. The output of the cascade of inverters in PLD 103N provides a response signal 225. One may monitor response signal 225 to determine whether the stimulus signal properly propagated through the cascade of PLDs 103A–103N.

Figure 6:
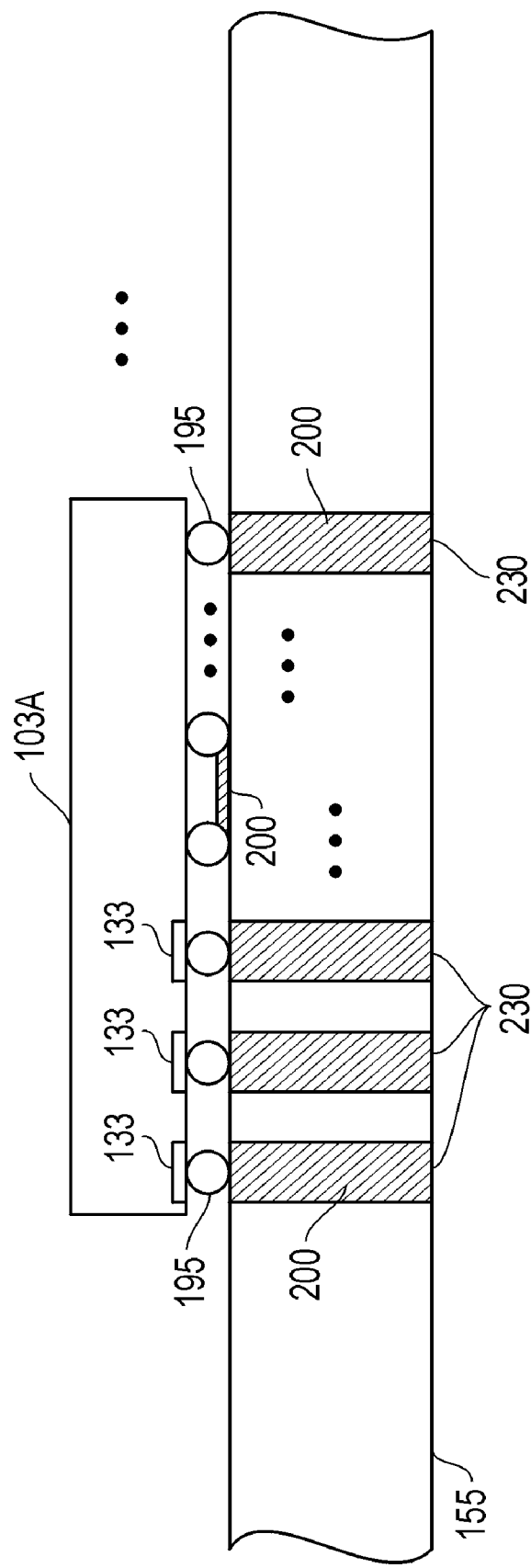
FIG. 6 depicts an embodiment of a portion of a test assembly according to the invention for implementing the conceptual circuit shown in FIG. 5.

Note that FIG. 5 constitutes a conceptual block diagram of the cascade of PLDs 103A–103N, and the circuitry within them. The actual circuitry may differ from the conceptual circuitry shown, as persons of ordinary skill in the art with the benefit of the description of the invention understand. For example, FIG. 5 neglects I/O circuitry 130 of each of PLDs 103A–103N and power and ground connections to PLDs 103A–103N for the sake of clarity of presentation FIG. 6 shows an embodiment of a portion of a test assembly 150 according to the invention for implementing the conceptual circuit shown in FIG. 5. FIG. 6 depicts partially how one of PLDs 103A–103N, specifically, PLD 103A, couples to, and mounts to or on PCB 155. One may apply a similar arrangement to PLDs 103B–103N.

Through I/O terminals 133, PLD 103A makes available to external circuitry (such as monitoring circuitry) intermediate signals within the cascade of inverters implemented in PLD 103A (see FIG. 5 above). Solder balls 195 couple those signals to PCB conductors 200. PCB conductors 200 couple the intermediate signals to traces or pads on the bottom of PCB 155. Alternatively, PCB conductors may couple the intermediate signals to traces or pads 230 on the top of PCB 155, or to traces or pads 230 on both the top and bottom of PCB 155, as desired. One may monitor or examine any of the intermediate signals by probing or monitoring traces or pads 230, as desired.

Figure 7:
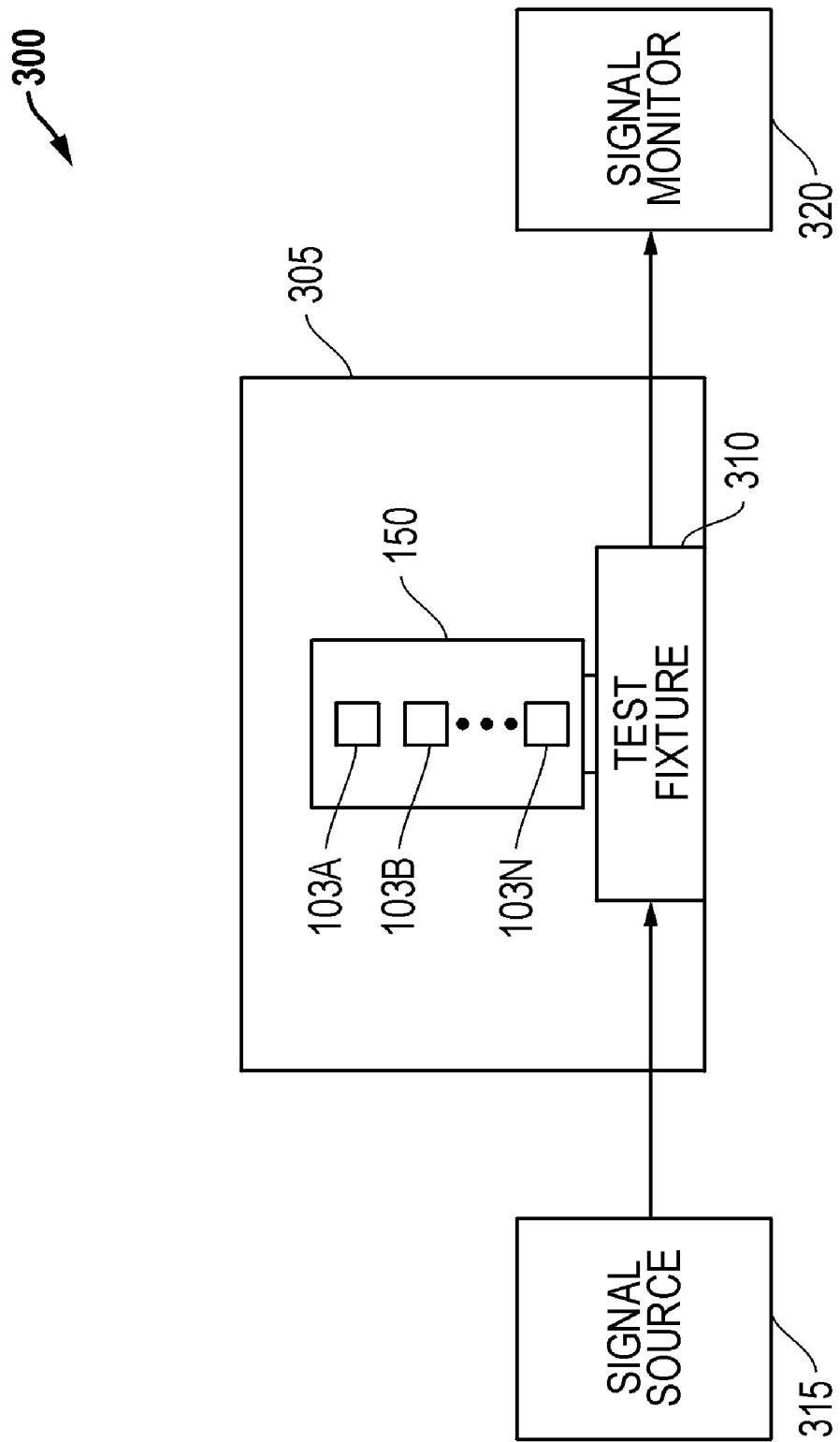
FIG. 7 shows an illustrative embodiment according to the invention of a test apparatus for assessing reliability of a test assembly.

FIG. 7 shows an illustrative embodiment according to the invention of a test apparatus 300 for assessing reliability of test assembly 150. As noted above, test assembly 150 may include one or more PLDs, as desired (e.g., PLDs 103A–103N in FIG. 2). Although one may perform reliability assessment of test assembly 150 by using a single PLD (for example, PLD 103A), the presence of multiple PLDs may have advantages under some conditions. For example, multiple PLDs may provide for determination of such reliability measures as mean time between failures (MTBF), failure rates (parts per million, or PPM), and the like. Also, the inclusion of multiple PLDs may provide a better mechanism for identifying (or ruling out) any faults or failures in the design and/or manufacture of the PLDs.

Test assembly 150 couples to or engages with test fixture 310, for example, via connector 160 (see FIG. 2). Test fixture 310 communicates with test assembly 150. Test fixture 310, for example, may provide power, ground, and stimulus signal 220 to test assembly 150. Test fixture 310 may receive output signals, such as response signal 225, from test assembly 150.

Test fixture 310 also has the capability to apply various stressors or stress factors to test assembly 150, as desired. For example, test fixture 310 may vibrate test assembly 150 during reliability assessment. As another example, test fixture may flex PCB 155 of test assembly 150 during reliability assessment. Each of the stressors or stress factors may result in failures in test assembly 150, as reflected, for example, in response signal 225, or in one or more of the intermediate signals within test assembly 150.

Test assembly 150 (and test fixture 310, as desired) may reside within test enclosure 305 during reliability assessment. Test enclosure 305 may have the capability to alter the environmental factors present during reliability assessment of test assembly 150. For example, test enclosure 305 may set the environmental temperature for test assembly 150 to a desired temperature, such as heat and cold extremes, or a temperature cycle, as desired. As another example, test enclosure 305 may subject test assembly to various humidity levels, such as extremes of dryness or humidity.

By varying the environmental conditions within test enclosure 305, one may conduct reliability assessment of test assembly 150 under a wide variety of conditions, as desired. Thus, one may ascertain a reliability profile for test assembly 150. By comparing reliability profiles for various test assemblies 150, one may assess the impact of changes in the design and/or manufacture of such test assemblies.

Signal source 315 couples to test fixture 310 and test assembly 150. Signal source 315 may perform a variety of functions. Signal source 315 may provide configuration data to PLDs 103A–103N within test assembly 150. Signal source 315 may further provide one or more stimulus signals 220 (such as clock signals) to test assembly 150. One may also use signal source 315 to control power signals provided to test assembly 150.

Moreover, one may use signal source 315 to control any or all of the environmental, physical, and other stressors or stress factors applied to test assembly 150 (e.g., change the temperature, humidity, vibration, and or flexing of test assembly 150). Thus, signal source 315 may provide control signals to test fixture 310, test assembly 150, and/or test enclosure 305, as desired. In exemplary embodiments, signal source 315 may constitute a personal computer, workstation, host, or similar device, as desired. Alternatively, signal source 315 may constitute a function generator, signal generator, or clock signal generator, as desired.

Signal monitor 320 also couples to test fixture 310 and test assembly 150. Signal monitor 320 may perform a variety of functions. Signal monitor 320 may monitor response signal 225 from test assembly 150. Signal monitor 320 may communicate with signal source 315, as desired. Signal monitor 320, in cooperation with signal source 315 and/or test fixture 310, may log and store a record of reliability assessment procedures and the conditions present during those procedures (e.g., time, temperature, humidity, etc.).

In exemplary embodiments, signal monitor 320 may constitute a personal computer, workstation, host, or similar device, as desired. Alternatively, signal monitor 320 may constitute a logic analyzer, oscilloscope, or other monitoring device or apparatus, as desired.

Note that one may combine the functionality of signal source 315 and signal monitor 320 into one device, as desired. For example, one may use a single personal computer to configure PLDs 103A–103N, control the provision of various signals to test assembly 150, to monitor signals provided by test assembly 150, and to provide a reliability assessment log. Note further that one may use a wide variety of control and instrumentation apparatus to control test assembly 150, test fixture 310, test enclosure 305, and to gather and log data and information, as persons of ordinary skill in the art who have the benefit of the description of the invention understand.

One may use test apparatus 300 to perform reliability assessment of test assembly 150 in a variety of ways, as desired. In an exemplary embodiment according to the invention, one may first configure or program PLDs 103A–103N, as described above. PLDs 103A–103N may each implement a cascade of logic blocks (e.g., inverters). One may then set the environmental and physical conditions (e.g., temperature, humidity, vibration) for the reliability assessment by using signal source 315.

Subsequently, one may provide stimulus signal 220 to PLDs 103A–103N. Stimulus signal 220 may have a variety of forms. For example, it may constitute a pulse waveform (a clock signal). One may use signal monitor 320 to monitor response signal 225 from test assembly 150. Signal monitor 320 may have the capability to perform various analyses of response signal 225, for example, amplitude and level analysis, frequency and timing analysis, and the like, as desired.

By knowing the logic functions that test assembly 150 performs on stimulus signal 220, one may determine in advance what characteristics response signal 225 should have. One may examine the actual response signal 225 to determine whether PLDs 103A–103N and the rest of the electrical and physical structures of test assembly 150 operate reliably and as expected. Furthermore, one may repeatedly provide stimulus signal 220 and monitor response signal 250, using the same or varying environmental, electrical, and/or physical conditions, and gather and log information about the test results, as desired. By doing so, one may obtain statistical measures about the reliability and/or performance of test assembly 150.

Figure 8B:
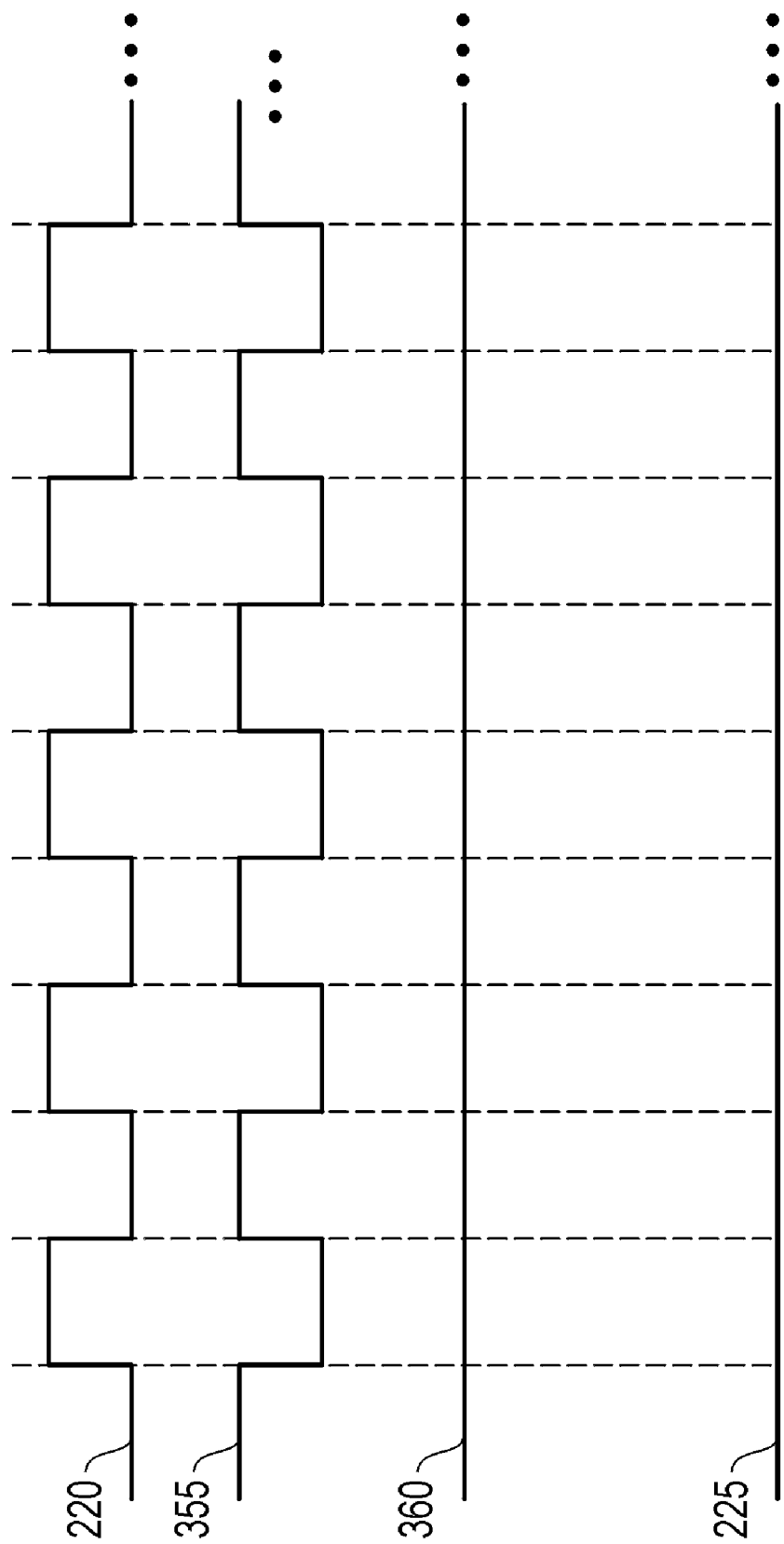

FIGS. 8A and 8B illustrate exemplary waveforms produced in an illustrative embodiment according to the invention of test apparatus 300. Note that FIGS. 8A and 8B may not accurately depict the timing of various events, such as circuit delays with respect to waveform periods and the like, for the sake of clarity of presentation. In a practical implementation, one may take into account the timing of various events, as desired. Doing so may allow a more detailed assessment of the reliability and/or performance of test assembly 150, as persons of ordinary skill in the art who have the benefit of the description of the invention understand.

FIG. 8A corresponds to a case where test assembly performs as expected or desired. In the example waveforms shown, stimulus signal 220 constitutes a pulse waveform, such as a clock signal. Under normal operating conditions, stimulus signal 220 propagates through various parts of test assembly 150. More specifically, stimulus signal 220 propagates through PLDs 103A–103N, causing PLD 103N to provide response signal 225.

Signal 355 and signal 360 may correspond to intermediate signals in test assembly 150. For example, signal 355 may correspond to the signal provided by PLD 103A to PLD 103B, and signal 360 may depict the signal that PLD 103B supplies to the next PLD in the cascaded PLDs, for example, PLD 103N. If response signal 225 propagates through test assembly 150, one may conclude that continuity exists not only in PLDs 103A–103N, but in all the relevant components of test assembly 150, such as PCB 155 and connector 160.

Moreover, if response signal 225 has expected characteristics, one may deduce that the circuitry within test assembly 150 performs as expected. Note that one may provide stimulus signal 220 to test assembly 150 any desired number of times and for any desired length of time. Thus, one may conduct reliability assessment for a given number of times or for a given length of time or until a failure or fault occurs, as desired. Furthermore, as noted above, one may change the environmental, electrical (e.g., power supply levels, and the like), and physical conditions during the reliability assessment, as desired.

FIG. 8B corresponds to a case where test assembly 150 experiences a failure. Here, intermediate signal 355 (e.g., the signal provided by PLD 103A to PLD 103B) shows continuity through PLD 103A. Intermediate signal 360 (e.g., the signal provided by PLD 103B to PLD 103N) and response signal 225, however, do not have expected characteristics; rather, they have a zero or nearly zero amplitude. Thus, one may deduce that at least one failure or fault exists somewhere in test assembly 150.

Depending on the signals at various points in test assembly 150, one may make various inferences about the likely cause or source of the failure or fault. For example, if an intermediate signal has a nearly zero amplitude, one may infer that one or more of PLDs 103A–103N, the board, or an interface between a PLD and the PCB (e.g., a solder joint) have failed. By probing I/O terminals 133 on various PLDs, one may pinpoint the problem or rule out PLDs 103A–103N as the source or cause of the problem. One may also probe various traces or pads on PCB 155, connector 160, and/or the interface between a PLD and the PCB to determine whether they constitute the source of the fault or failure.

As another example, an intermediate signal or response signal 225 may have substantially the expected shape, but have lower amplitudes than expected. In that case, one may infer that one or more of the PLDs 103A–103N have failed and/or poor continuity exists somewhere in test assembly 150 (e.g., the PCB, or the interface between a PLD and the PCB, such as a solder joint). Using a procedure similar to the procedure described above, one may pinpoint the source or cause of the fault or failure.

Note that a fault or failure does not necessarily result from failure of test assembly 150 or its components, such as PCB 155. Faults or failures may constitute soft failures, which may be intermittent. For example, temporary loss of connection (e.g., in connector 160) may cause a soft or intermittent failure. Also, power fluctuations during test and reliability assessment cycles may cause one or more of PLDs 103A–103N to lose its configuration data. For instance, one of configuration memories 118 may lose its contents, or its contents may become corrupted, thus resulting in the corresponding PLD failing to implement the desired logic functionality. In the event of such soft or intermittent failures, one may remedy the situation and resume testing and reliability assessment of test assembly 150 or re-start the cycle, as desired.

In contrast, some other faults or failures may have a more permanent nature. In other words, they may result from component (e.g., PLDs 103A–103N, PCB 155, and/or connector 160) failures within test assembly 150 (e.g., a solder joint between a PLD and the PCB). In such a situation, one may perform further testing and assessment of test assembly 150, using various techniques as described below.

To analyze the fault or failure, one may resort to a broad range of non-destructive analysis techniques, as desired, and as persons of ordinary skill in the art who have the benefit of the description of the invention understand. As one example of non-destructive analysis, one may use time-domain reflectometry (TDR) to help pinpoint where a discontinuity exists in test assembly 150. As another example, one may probe various points of test assembly 150 and/or make resistance measurements to determine the point of discontinuity. As yet another example, one may use X-rays to locate failure points or modes (assuming that X-rays do not destroy or degrade any part of test assembly 150).

Furthermore, one may apply a variety of destructive analysis techniques, as desired, and as persons of ordinary skill in the art with the benefit of the description of the invention understand. For example, one may employ dye penetrant analysis to locate fault or failure points in PCB 155. Furthermore, one may use cross-section analysis (e.g., cutting or dissecting PCB 155 to examine the cross section, scanning electron microscopy (SEM)), and the like, as desired. Note that one may employ destructive and non-destructive analyses in any desired order. Conducting non-destructive analysis first, however, provides the benefit of performing non-destructive analysis before destructive analysis makes test assembly 150 inoperable or otherwise unusable.

The description of the illustrative embodiments refers to PCBs. Note, however, that one may use other circuit assemblies, as desired. Because of the flexibility of the inventive concepts, one may apply them effectively to other circuit or test assemblies, as desired, by making modifications that fall within the knowledge of persons skilled in the art with the benefit of the description of the invention.

The illustrative embodiments of the invention described in this application refer to PLDs. Note, however, that one may apply the inventive concepts effectively to circuitry known by other names in the art, such as complex programmable logic device (CPLD), programmable gate array (PGA), field programmable gate array (FPGA), and erasable programmable read-only memory (EPROM), as desired. The choice of circuitry depends on the design and performance specifications for a particular application and depends on factors that fall within the knowledge of persons skilled in the art with the benefit of the description of the invention.

Although the description of the invention sometimes refers to specific sizes of inputs, outputs, and the like, one may apply the circuitry and inventive concepts described to a wide variety of other situations. For example, one may modify and generalize the circuitry and concepts to accommodate other sizes of the various variables, such as input sizes, output sizes, number of inputs, outputs, and signals, and the like. Such modifications fall within the knowledge of persons of ordinary skill in the art who have the benefit of the description of the invention.

Referring to the figures, the various blocks shown depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only. The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. An apparatus for performing reliability assessment, the apparatus comprising:
   a test assembly, comprising:
      at least one programmable logic device (PLD), the at least one programmable logic device configured to provide a logic functionality;
   a signal source coupled to the test assembly, the signal source adapted to provide a stimulus signal to the test assembly; and
   a signal monitor coupled to the test assembly, the signal monitor adapted to monitor a response signal generated by the test assembly.

2. The apparatus according to claim 1, wherein the response signal is generated by the test assembly in response to the stimulus signal provided by the signal source.

3. The apparatus according to claim 2, wherein the response signal indicates whether the stimulus signal has propagated through the test assembly.

4. The apparatus according to claim 3, wherein the test assembly further comprises a printed circuit board (PCB).

5. The apparatus according to claim 4, wherein the at least one programmable logic device is mounted to the printed circuit board.

6. The apparatus according to claim 5, wherein the at least one programmable logic device further comprises a plurality of input/output terminals, and wherein the printed circuit board further comprises a plurality of conductors coupled to the plurality of input/output terminals of the at least one programmable logic device.

7. The apparatus according to claim 6, wherein the at least one programmable logic device is further configured to implement the logic functionality of a cascade of a plurality of inverters.

8. The apparatus according to claim 7, wherein the plurality of input/output terminals of the at least one programmable logic device couple, respectively, to an input and an output of each inverter in the plurality of inverters implemented by the at least one programmable logic device.

9. The apparatus according to claim 8, wherein the stimulus signal comprises a clock signal.

10. The apparatus according to claim 8, wherein the signal source comprises a computer.

11. The apparatus according to claim 8, wherein the signal monitor comprises a logic analyzer.

12. The apparatus according to claim 10, wherein the computer is adapted to configure the at least one programmable logic device.

13. The apparatus according to claim 5, further comprising a test fixture, wherein the test assembly couples to the test fixture.

14. The apparatus according to claim 13, further comprising a test enclosure, wherein the test enclosure encloses the test assembly and the test fixture, and wherein the test enclosure is adapted to control an ambient temperature within the test enclosure.

15. The apparatus according to claim 14, wherein the test enclosure is further adapted to control an ambient humidity within the test enclosure.

16. The apparatus according to claim 13, wherein the test fixture is adapted to vibrate the test assembly.

17. The apparatus according to claim 16, wherein the test fixture is further adapted to flex the printed circuit board.

18. The apparatus according to claim 17, wherein the test fixture is further adapted to supply power to the test assembly.

19. An apparatus, comprising:
a printed circuit board (PCB);
a plurality of programmable logic devices (PLDs) mounted to the printed circuit board;
a signal generator, the signal generator configured to provide a stimulus signal to the printed circuit board; and
a signal monitor, the signal monitor configured to monitor a response signal provided by the printed circuit board.

20. The apparatus according to claim 19, wherein each of the plurality of programmable logic devices is configured to realize a logic function.

21. The apparatus according to claim 20, wherein the plurality of programmable logic devices are coupled as a cascade.

22. The apparatus according to claim 21, wherein the printed circuit board is adapted to supply the stimulus signal to a first programmable logic device in the plurality of programmable logic devices.

23. The apparatus according to claim 22, wherein the printed circuit board is further adapted to receive the response signal from a last programmable logic device in the plurality of programmable logic device, and wherein the printed circuit board is further adapted to supply the response signal to the signal monitor.

24. The apparatus according to claim 23, wherein each programmable logic device in the plurality of programmable logic devices is further configured to implement the logic function of a cascade of a plurality of inverters.

25. The apparatus according to claim 23, wherein each programmable logic device in the plurality of programmable logic devices comprises a plurality of input/output terminals, and wherein the printed circuit board further comprises a plurality of conductors coupled to the plurality of input/output terminals of each programmable logic device.

26. The apparatus according to claim 25, wherein the plurality of input/output terminals of each programmable logic device couple, respectively, to an input and an output of each inverter in the plurality of inverters implemented by the respective programmable logic device.

27. A reliability assessment apparatus, comprising:
a printed circuit board (PCB); and
a programmable logic device mounted to the printed circuit board,
wherein the printed circuit board is adapted to provide a stimulus signal to the programmable logic device, and
wherein the printed circuit board is adapted to provide a response signal, the response signal adapted to indicate continuity in a signal propagation path that includes the printed circuit board and the programmable logic device.

28. The apparatus according to claim 27, wherein the programmable logic device is configured to implement a logic function.

29. The apparatus according to claim 28, further comprising a signal source, the signal source adapted to supply the stimulus signal to the printed circuit board.

30. The apparatus according to claim 29, further comprising a signal monitor, the signal monitor adapted to receive the response signal from the printed circuit board.

31. The apparatus according to claim 30, wherein the response signal indicates a failure within the printed circuit board.

32. The apparatus according to claim 30, wherein the response signal indicates a failure within the programmable logic device.

33. The apparatus according to claim 30, wherein the programmable logic device is further configured to implement the logic function of a cascade of a plurality of inverters.

34. A method of assessing reliability of a circuit assembly, the method comprising:
providing the circuit assembly, the circuit assembly including a programmable logic device;
supplying a stimulus signal to the circuit assembly; and
receiving a response signal from the circuit assembly,
wherein the response signal is adapted to indicate a failure within the circuit assembly.

35. The method according to claim 34, wherein the circuit assembly in providing the circuit assembly further comprises a printed circuit board, and wherein the programmable logic device is mounted to the printed circuit board.

36. The method according to claim 35, further comprising operating the circuit assembly in presence of a prescribed ambient temperature.

37. The method according to claim 36, further comprising operating the circuit assembly in presence of a prescribed ambient humidity level.

38. The method according to claim 37, further comprising vibrating the circuit assembly.

39. The method according to claim 38, further comprising flexing the circuit assembly.

40. The method according to claim 35, further comprising configuring the programmable logic device to implement the function of a plurality of inverters coupled as a cascade.

41. The method according to claim 40, wherein the stimulus signal in supplying a stimulus signal to the circuit assembly comprises a clock signal.

42. The method according to claim 41, further comprising using a computer to supply the stimulus signal to the circuit assembly.

43. The method according to claim 40, further comprising using a logic analyzer to receive the response signal from the circuit assembly.

44. The method according to claim 35, further comprising using the response signal to detect a failure within the programmable logic device.

45. The method according to claim 35, further comprising using the response signal to detect a failure within the printed circuit board.

46. The method according to claim 35, further comprising using the response signal to assess signal propagation through a path that includes the circuit assembly.

47. The method according to claim 35, further comprising using the response signal to assess signal propagation through a path that includes the programmable logic device and the printed circuit board.

48. The method according to claim 35, further comprising performing non-destructive failure analysis of the test assembly.

49. The method according to claim 48, further comprising probing at least one input/output terminal of the programmable logic device.

50. The method according to claim 48, further comprising performing time domain reflectometry analysis of the circuit assembly.

51. The method according to claim 50, further comprising performing X-ray analysis of the circuit assembly.

52. The method according to claim 35, performing destructive failure analysis of the test assembly.

53. The method according to claim 52, further comprising performing dye penetrant analysis of the circuit assembly.

54. The method according to claim 53, further comprising performing cross section analysis of the circuit assembly.

55. The method according to claim 54, further performing scanning electron microscopy analysis of the circuit assembly.

* * * * *